United States Patent
Shimasaki et al.

(10) Patent No.: US 9,515,214 B2
(45) Date of Patent: Dec. 6, 2016

(54) SOLAR BATTERY MODULE AND MANUFACTURING METHOD THEREOF

(75) Inventors: Koji Shimasaki, Chiyoda-ku (JP); Masayoshi Suzuki, Chiyoda-ku (JP)

(73) Assignee: MITSUBISHI ELECTRIC CORPORATION, Chiyoda-Ku, Tokyo (JP)

(*) Notice: Subject to any disclaimer, the term of this patent is extended or adjusted under 35 U.S.C. 154(b) by 0 days.

(21) Appl. No.: 13/806,793

(22) PCT Filed: Jul. 2, 2010

(86) PCT No.: PCT/JP2010/061334
§ 371 (c)(1),
(2), (4) Date: Dec. 24, 2012

(87) PCT Pub. No.: WO2012/001815
PCT Pub. Date: Jan. 5, 2012

(65) Prior Publication Data
US 2013/0098423 A1    Apr. 25, 2013

(51) Int. Cl.
*H01L 31/02*    (2006.01)
*H01L 31/05*    (2014.01)

(52) U.S. Cl.
CPC ........... *H01L 31/05* (2013.01); *H01L 31/0201* (2013.01); *H01L 31/0504* (2013.01); *Y02E 10/50* (2013.01)

(58) Field of Classification Search
CPC ........... H01L 31/048; H01L 31/02008; H01L 31/0508; H01L 31/02013; H01L 31/022425; H01L 31/042; H01L 31/0504; H01L 31/18; H01L 31/0201; H01L 31/05; H02M 2007/4835; H02M 2007/003; Y02E 10/50; H02S 40/34
USPC .................................................. 136/243–265
See application file for complete search history.

(56) References Cited

U.S. PATENT DOCUMENTS 5,994,641 A * 11/1999 Kardauskas et al. .......... 136/246
6,262,358 B1 * 7/2001 Kamimura et al. .......... 136/244

(Continued)

FOREIGN PATENT DOCUMENTS

EP    1030376 A1    8/2000
EP    1816684 A2    8/2007

(Continued)

OTHER PUBLICATIONS

Office Action (Notice of Rejection) dated May 21, 2013, issued in corresponding Japanese Patent Application No. 2012-522412, and an English Translation of the Office Action. (3 pages).
International Search Report (PCT/ISA/210) issued on Aug. 17, 2010, by the Japanese Patent Office as the International Searching Authority for International Application No. PCT/JP2010/061334.

(Continued)

*Primary Examiner* — Mayla Gonzalez Ramos
(74) *Attorney, Agent, or Firm* — Buchanan Ingersoll & Rooney PC

(57) ABSTRACT

A solar battery module includes: a plurality of solar battery cells, a plain shape of each being a substantial rectangle, and a ratio of a short side length and a long side length of the substantial rectangle being 1/n:1 (n is an integer equal to or larger than 2), includes a plurality of light-receiving-surface bus electrodes parallel to the short side of the substantial rectangle on a light receiving surface, and includes rear-surface bus electrodes each at a position on a non-light-receiving surface corresponding to each of the light-receiving-surface bus electrodes; and a light-receiving-surface lead (an interconnector) that electrically connects the light-receiving-surface bus electrodes of one of the solar battery cells to the rear-surface bus electrodes of adjacent one of the solar battery cells.

11 Claims, 10 Drawing Sheets

(56) References Cited

U.S. PATENT DOCUMENTS

| | | | |
|---|---|---|---|
| 8,049,096 B2 | 11/2011 | Yagiura et al. | |
| 2007/0175509 A1* | 8/2007 | Yagiura et al. | 136/256 |
| 2007/0283995 A1 | 12/2007 | Okamoto et al. | |
| 2010/0126550 A1* | 5/2010 | Foss | 136/244 |
| 2010/0295377 A1* | 11/2010 | Sok et al. | 307/82 |
| 2011/0214713 A1* | 9/2011 | Hou et al. | 136/251 |
| 2012/0012152 A1 | 1/2012 | Yagiura et al. | |

FOREIGN PATENT DOCUMENTS

| | | | |
|---|---|---|---|
| JP | 7-106619 A | | 4/1995 |
| JP | 07106619 A | * | 4/1995 |
| JP | 11-251613 A | | 9/1999 |
| JP | 2000-164901 A | | 6/2000 |
| JP | 2006-120944 A | | 5/2006 |
| WO | WO 2005/096396 A1 | | 10/2005 |

OTHER PUBLICATIONS

Written Opinion (PCT/ISA/237) issued on Aug. 17, 2010, by the Japanese Patent Office as the International Searching Authority for International Application No. PCT/JP2010/061334.

Japanese Notice of Rejection dated Aug. 12, 2014 issued in the corresponding Japanese Patent Application 2013-240845 and English language translation (3 pages).

German Office Action dated Aug. 12, 2014 issued in the corresponding German Patent Application 112010005717.6 and English language translation (12 pages).

Chinese Notification of First Office Action dated Dec. 2, 2014 issued in the corresponding Chinese Patent Application 201080067773.1 and English language translation (10 pages).

Chinese Notification of the Second Office Action dated Jul. 22, 2015 issued in the corresponding Chinese Patent Application 201080067773.1 and English language translation (7 pages).

* cited by examiner

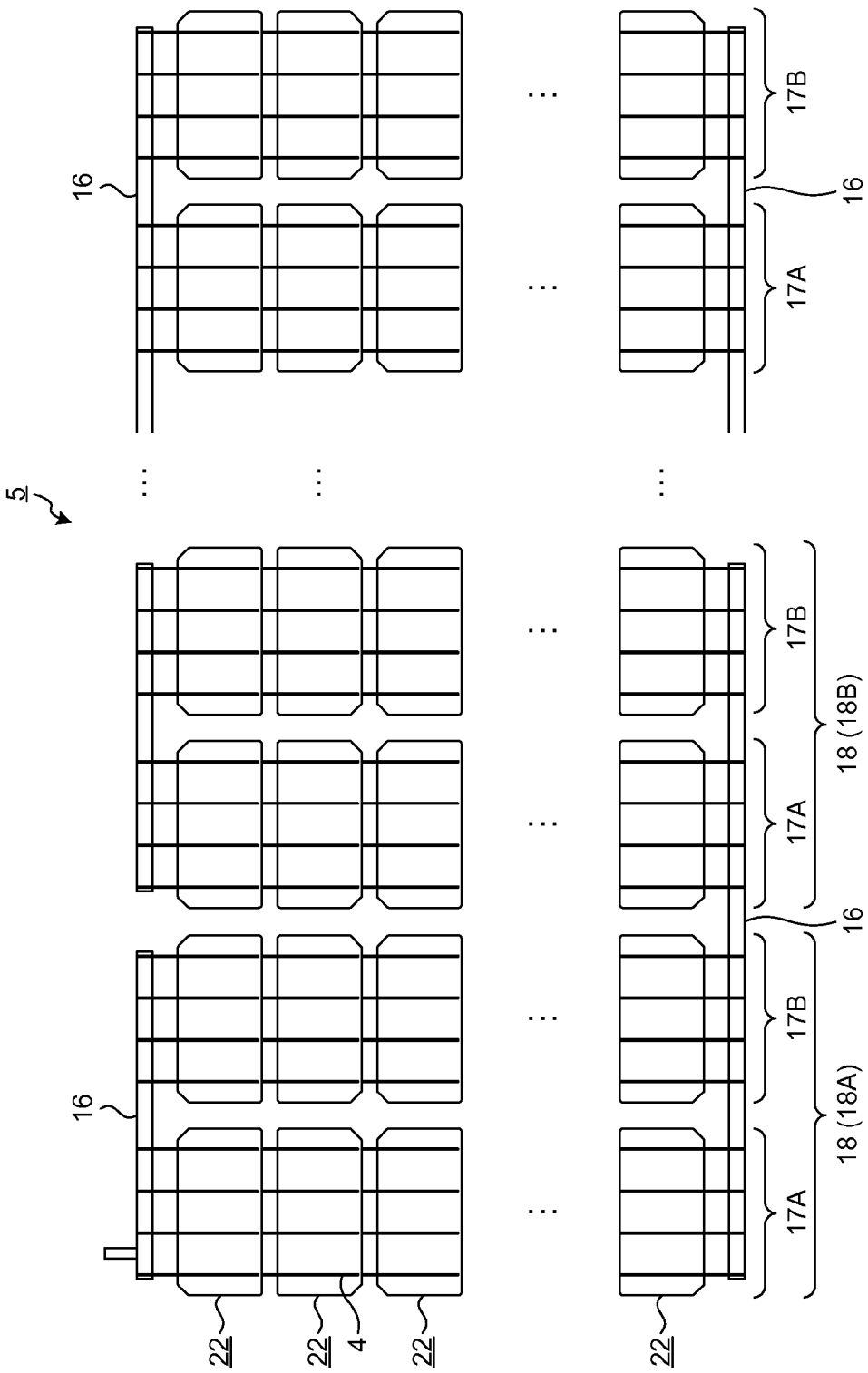

SOLAR BATTERY MODULE AND MANUFACTURING METHOD THEREOF

FIELD

The present invention relates to a solar battery module, a plurality of which are arranged and installed on a roof or the like in a solar power generation system that converts light energy of the sun and the like into electric energy, and to a manufacturing method thereof.

BACKGROUND

Power generation performance of a crystal solar battery module that uses a wafer made of silicon serving as a main material is improved by improvement in performance of a solar battery cell serving as a power generation element.

However, with improvement in efficiency of a cell, an electric current is increased and a resistance loss at a wiring member (an interconnector) that is mainly made of copper and connects cells to each other at the time of modularization is also increased. Accordingly, performance after modularization is not improved for an amount corresponding to an amount of the improvement in the performance of a cell, but is reduced for an amount of increase in the resistance loss at the interconnector.

As a remedy for this problem, there has been conventionally proposed a technique of reducing a resistance loss by increasing a cross-sectional area of an interconnector (see Patent Literature 1, for example).

CITATION LIST

Patent Literature

Patent Literature 1: Japanese Patent Application Laid-open No. H11-251613

SUMMARY

Technical Problem

However, to increase the cross-sectional area of the interconnector as conventionally proposed, a width or a thickness of the interconnector needs to be increased. If the width is increased, a light-receiving area of a cell is reduced and a power generation amount is also reduced. Accordingly, increasing the thickness is generally conceived. However, by an influence of heat applied when the interconnector is solder-joined to an electrode on a cell, residual stress generated in the cell is increased and thus the probability that the cell is broken is increased and a yield is deteriorated.

The present invention has been achieved in view of the above problems, and an object of the present invention is to provide a solar battery module that can improve an output without increasing a cross-sectional area of an interconnector, and a manufacturing method thereof.

Solution to Problem

In order to solve the afore-mentioned problems, a solar battery module according to one aspect of the present invention is constructed in such a manner as to include: a plurality of solar battery cells, a plain shape of each being a substantial rectangle, and a ratio of a short side length and a long side length of the substantial rectangle being 1/n:1 (n is an integer equal to or larger than 2), includes a plurality of light-receiving-surface bus electrodes parallel to the short side of the substantial rectangle on a light receiving surface, and includes rear-surface bus electrodes each at a position on a non-light-receiving surface corresponding to each of the light-receiving-surface bus electrodes; and an interconnector that electrically connects the light-receiving-surface bus electrodes of a first one of the solar battery cells to the rear-surface bus electrodes of an adjacent second one of the solar battery cells.

In order to solve the afore-mentioned problems, a manufacturing method of a solar battery module according to another aspect of the present invention includes the steps of: dividing a basic solar battery cell with a plane shape thereof being a substantial square, which includes n light-receiving-surface electrode areas in each of which a plurality of light-receiving-surface bus electrodes parallel to a side of the substantial square and a plurality of grid electrodes perpendicular to the light-receiving-surface bus electrodes are provided on a light-receiving surface side and includes rear-surface bus electrodes each at a position on a non-light-receiving surface side corresponding to each of the light-receiving-surface bus electrodes, into n along respective boundaries of the n light-receiving-surface electrode areas, thereby obtaining divided solar battery cells, each having a plain of a substantial rectangle with a ratio of a short side length and a long side length of the substantial rectangle being 1/n:1 (n is an integer equal to or higher than 2); and electrically connecting the light-receiving-surface bus electrodes of a first one of the divided solar battery cells to the rear-surface bus electrodes of a second adjacent one of the divided solar battery cells by an interconnector.

Advantageous Effects of Invention

According to the solar battery module of the present invention, because an electric current flowing in the interconnector that serially connects plural cells to each other can be reduced, a resistance loss can be reduced and an output of the solar battery module can be improved. A polycrystalline wafer or a mono-crystalline wafer serving as a substrate of a cell is generally of a square shape, and a cell can be easily obtained by cutting this wafer into half.

According to the manufacturing method of a solar battery module of the present invention, a first solar battery cell is divided into n along respective boundaries of n light-receiving-surface electrode areas, thereby obtaining a second solar battery cell in which a ratio of a short side length and a long side length of a substantial rectangle is 1/n:1 (n is an integer equal to or larger than 2), and light-receiving bus electrodes of the second solar battery cell are electrically connected to rear-surface bus electrodes of an adjacent solar battery cell by an interconnector. Accordingly, a solar battery module with a resistance loss being reduced can be easily produced.

BRIEF DESCRIPTION OF DRAWINGS

FIG. 15 is a schematic diagram of a method of connection in a cell array according to the third embodiment.

DESCRIPTION OF EMBODIMENTS

Exemplary embodiments of a solar battery module and a manufacturing method thereof according to the present invention will be explained below in detail with reference to the accompanying drawings. The present invention is not limited to the embodiments.

First Embodiment.

Figure 1:
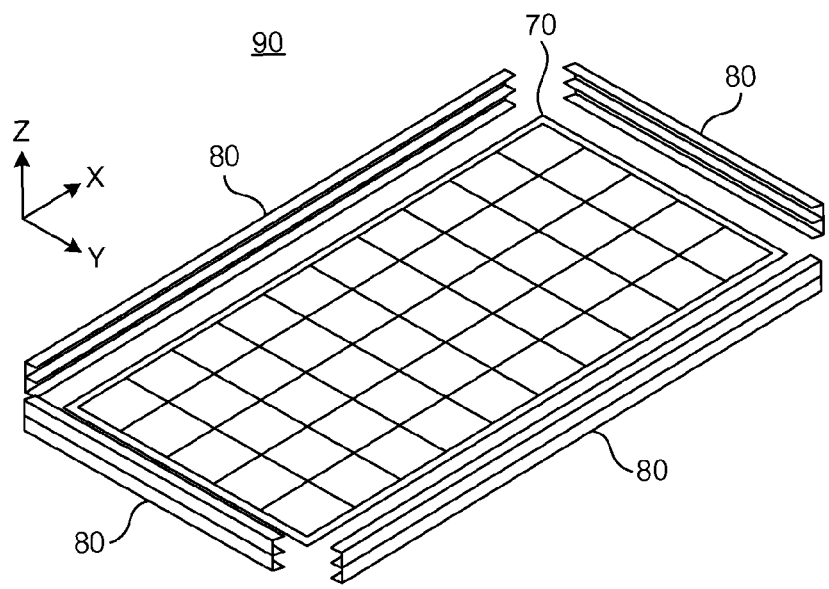
FIG. 1 is a perspective view of a solar battery module and depicts a state in which a frame member is being attached to a solar battery panel.
Figure 2:
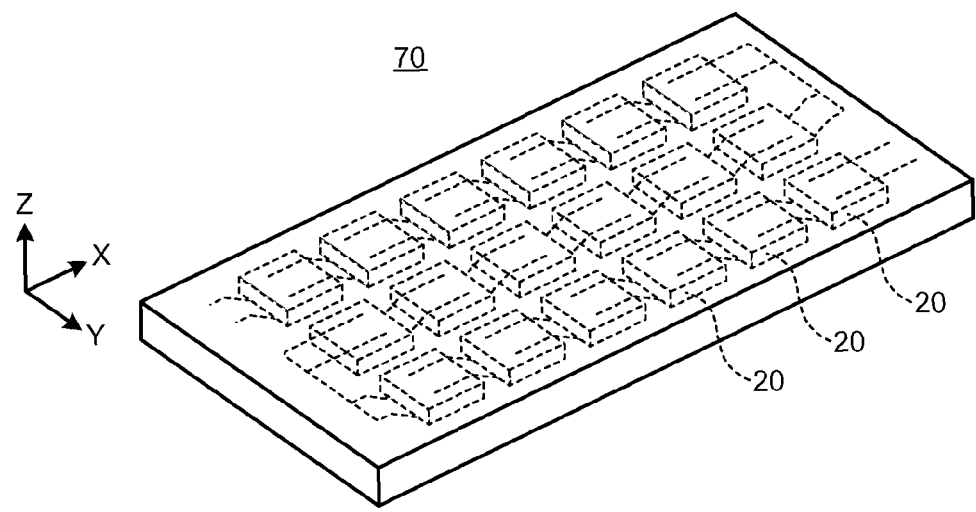
FIG. 2 is a perspective view of a state in which a cell array formed by sequentially connecting a plurality of solar battery cells is sealed with a lead in the solar battery panel.
Figure 3:
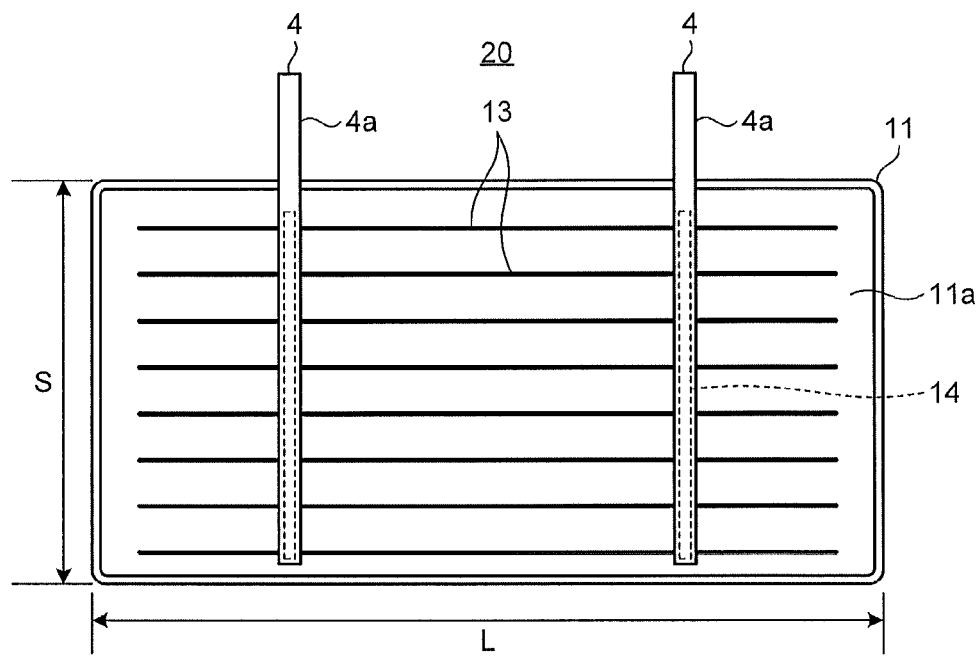
FIG. 3 is a top view of a state in which a light-receiving-surface bus electrode is joined to a solar battery cell.
Figure 4:
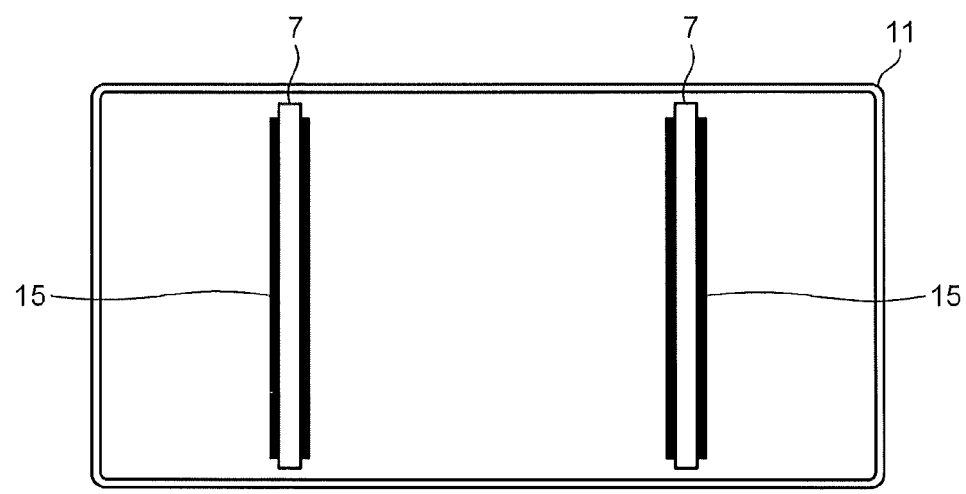
FIG. 4 is a rear view of a state in which a rear-surface bus electrode is joined to the solar battery cell.
Figure 5:
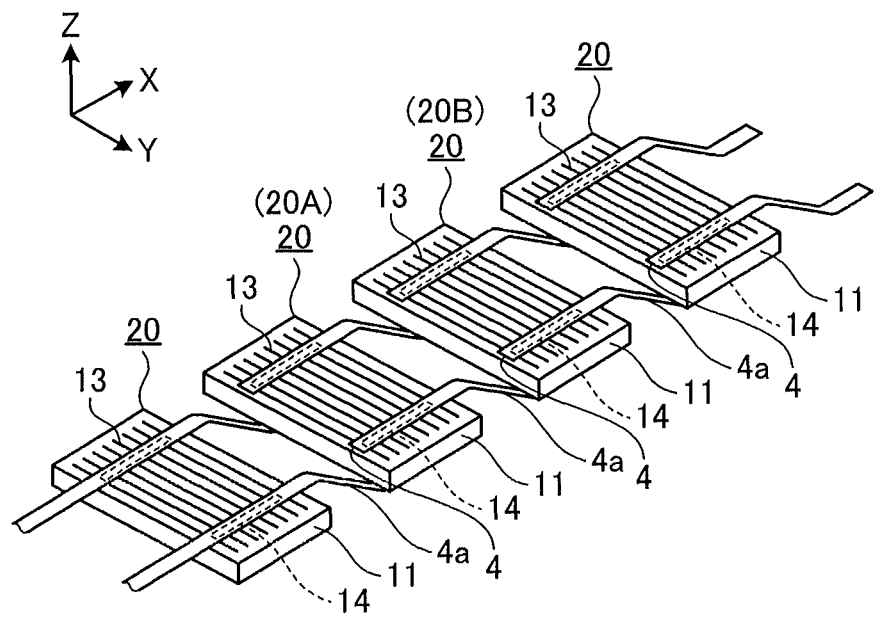
FIG. 5 is a perspective view of a state in which the solar battery cells are serially connected to each other, as viewed from above.
Figure 6:
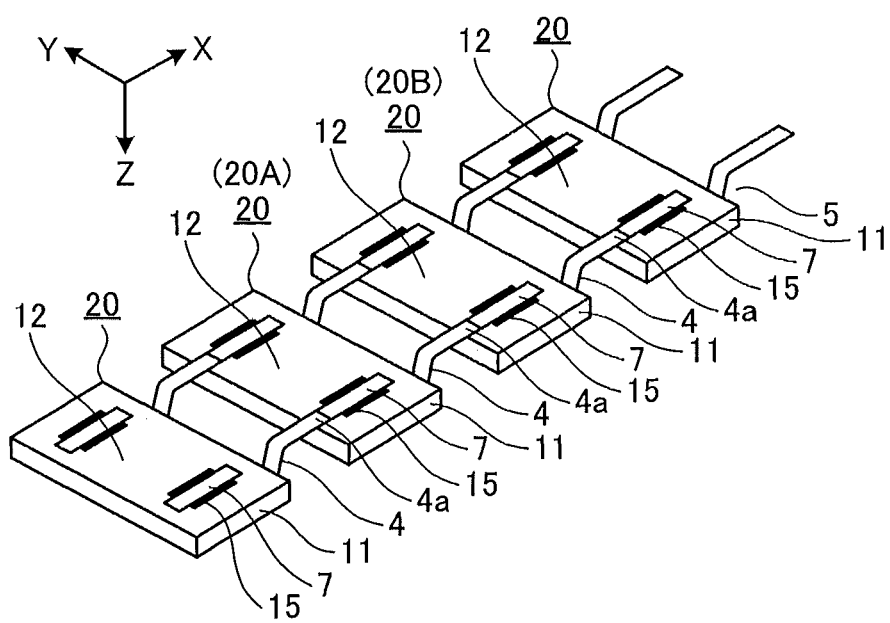
FIG. 6 is a perspective view of the state in which the solar battery cells are serially connected to each other, as viewed from below.
Figure 7:
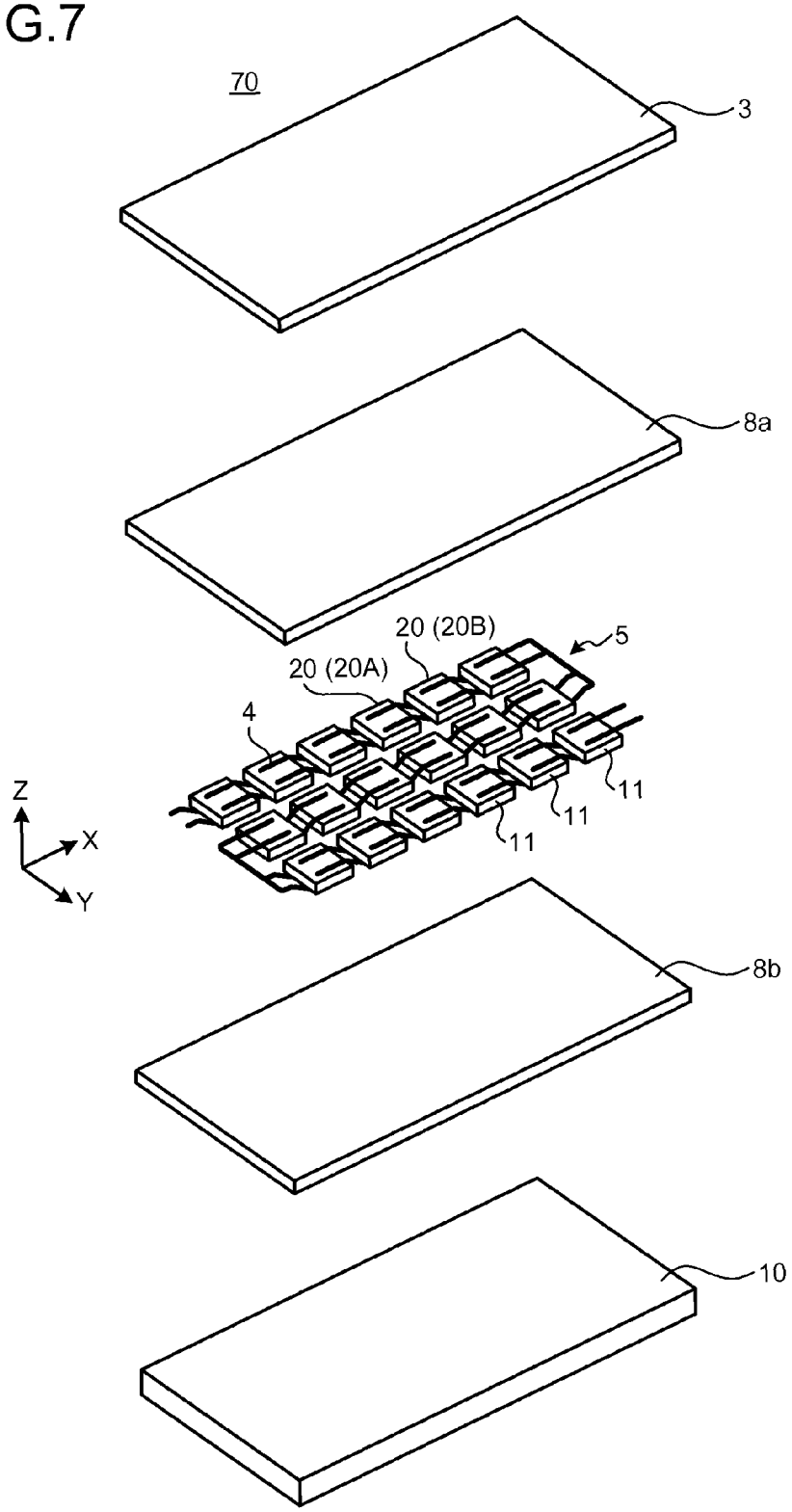
FIG. 7 is an exploded perspective view of the solar battery cell and depicts a state in which components are stacked.
Figure 8:
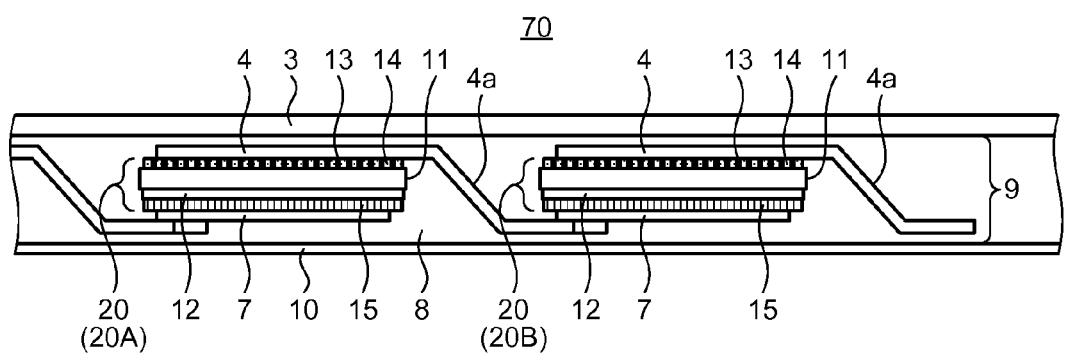
FIG. 8 is a cross-sectional view of a connection state of two adjacent solar battery cells.

FIG. 1 is a perspective view of a solar battery module and depicts a state in which a frame member is being attached to a solar battery panel. FIG. 2 is a perspective view of a state in which a cell array formed by sequentially connecting a plurality of solar battery cells is sealed with a lead in the solar battery panel. FIG. 3 is a top view of a state in which a light-receiving-surface bus electrode is joined to a solar battery cell. FIG. 4 is a rear view of a state in which a rear-surface bus electrode is joined to the solar battery cell. FIG. 5 is a perspective view of a state in which the solar battery cells are serially connected to each other, as viewed from above. FIG. 6 is a perspective view of the state in which the solar battery cells are serially connected to each other, as viewed from below. FIG. 7 is an exploded perspective view of the solar battery cell and depicts a state in which components are stacked. FIG. 8 is a cross-sectional view of a connection state of two adjacent solar battery cells.

A solar battery module 90 has a flat-plate-shaped solar battery panel 70 and a frame member 80 that surrounds outer edge of the solar battery panel 70 over the whole circumference thereof (FIG. 1). The solar battery panel 70 is configured by sealing a plurality of solar battery cells 20 arranged vertically and horizontally with a resin, covering a light-receiving-surface side thereof with a front-surface cover material 3 such as glass with translucency, and covering a rear surface side (a non-light-receiving surface side) thereof with a rear-surface cover material 10 (FIGS. 7 and 8).

The solar battery cells 20 are connected serially to each other in an X direction as a first direction in the drawings with a light-receiving surface lead (an interconnector) 4 and a rear surface lead (an interconnector) 7 (FIGS. 5 to 7). However, at ends of the solar battery panel 70, some solar battery cells are connected to each other in a Y direction. As the light-receiving surface lead 4 and the rear surface lead 7, band-shaped copper foil to which solder is supplied (coated or applied), generally called a tab line is used. A cell array 5 formed by sequentially connecting the solar battery cells 20 with the leads 4 and 7 is sealed within the solar battery panel 70 with a resin 8 (FIG. 2).

The frame member 80 is produced by extrusion molding of aluminum or the like and covers the outer edge of the solar battery panel 70 over the whole circumference with a U-shaped portion having a U-shaped cross section (FIG. 1). The frame member 80 is fixed via a butyl sealing material or a silicon adhesive to the solar battery panel 70 to reinforce the solar battery panel 70 and serves to attach the solar battery panel 70 to a stand provided on a construction such as a residence or a building, the ground, or a structure.

The solar battery panel 70 is configured by stacking the translucent front-surface cover material (glass) 3, a cell arrangement layer 9 in which the solar battery cells 20, and the light-receiving surface lead 4 and the rear surface lead 7 serially connecting the solar battery cells 20 to each other are sealed by the resin 8 (8a, 8b) such as EVA (ethylene vinyl acetate), and a back sheet 10 (the rear-surface cover material) that is made of PET (polyethylene terephthalate), PVF (polyvinyl fluoride), or the like and has excellent weather resistance in this order from the light-receiving surface side (FIGS. 7 and 8).

As shown in FIGS. 3 and 4, the solar battery cell 20 according to the present embodiment has a substantially-rectangular plane shape and a ratio of a short side length S and a long side length L of the rectangular is 1/2:1. A conventional solar battery cell is generally a 156 mm×156 mm square or a 125 mm×125 mm square. However, because the solar battery cell 20 according to the present embodiment is produced by dividing a solar battery cell produced in a square of the dimension mentioned above into two in the first direction at the time of connection (the direction in which a light-receiving-surface bus electrode (a light-receiving-surface lead-connection electrode) 14 extends), the solar battery cell 20 has the shape as mentioned above.

The solar battery cell 20 is configured as follows by using p-type silicon having a thickness of about 150 to 300 micrometers as a substrate. An n-type diffusion layer (an impurity-layer diffusion layer, not shown) is formed by phosphorous diffusion on a front surface side of a p-type silicon substrate 11 serving as a p-type layer. An antireflection film 11a (FIG. 3) made of a silicon nitride film for preventing reflection of incident light to improve a conversion efficiency is further provided by surface treatment, so that a light-receiving surface of the solar battery cell 20 is provided. On a rear-surface side of the p-type silicon substrate (hereinafter, simply "substrate") 11, a p+ layer (not shown) containing high-density impurities is formed and a rear-surface collecting electrode 12 made of aluminum is further provided over a substantially entire rear surface to reflect the incident light and extract electric power.

A grid electrode 13 that is a thin electrode made of silver and the light-receiving-surface bus electrode (the light-receiving-surface lead-connection electrode) 14 that is made of silver as the grid electrode 13 and has a predetermined width are formed on the light receiving surface of the substrate 11 as a light-receiving-surface side electrode that extracts electric energy converted from the incident light, and these electrodes are electrically connected to the n-type diffusion layer at bottom surfaces thereof. Two light-receiving-surface bus electrodes 14 are formed in parallel along the first direction as the direction of connecting the solar battery cells 20. A large number of the grid electrodes 13 are formed thin in a direction perpendicular to the light-receiving-surface bus electrode 14. The grid electrode 13 is formed as thin as possible and to be all over the light-receiving surface (the front surface) to extract electric power generated at the light receiving surface with no waste. When sunlight hits the solar battery cell 20, the light-receiving-surface side shown in FIG. 3 becomes a negative (−) electrode and the rear-surface side shown in FIG. 4 becomes a positive (+) electrode. The light-receiving-surface bus electrode 14 is provided so that the light-receiving surface lead 4 is connected thereto for further externally extracting electric energy collected by the grid electrode 13 (FIG. 3). While the light-receiving-surface bus electrode 14 is shown as being narrower than the light-receiving surface lead 4 in FIGS. 3 and 5, this is for showing a state in which the light-receiving-surface bus electrode 14 overlaps the light-receiving surface lead 4 to be easily understood and the light-receiving-surface bus electrode 14 and the light-receiving surface lead 4 practically have the same width.

Meanwhile, the rear-surface collecting electrode 12 made of aluminum is provided on the rear surface of the substrate 11 to cover the substantially entire rear surface. A rear-surface bus electrode (a rear-surface lead-connection electrode) 15 made of silver is formed at a position on the rear surface of the substrate 11 corresponding to the grid electrode 13 (at a position where the rear-surface bus electrode 15 overlaps the grid electrode 13 in a thickness direction of the substrate 11) to extend in the first direction as the direction of connecting the solar battery cells 20. The rear-surface bus electrode 15 is provided so that the rear surface lead 7 is connected thereto for further externally extracting electric energy collected by the rear-surface collecting electrode 12 (FIG. 4). While the rear-surface bus electrode 15 is shown as being wider than the rear surface lead 7 in FIGS. 4 and 6, this is for showing a state in which the rear-surface bus electrode 15 overlaps the rear surface lead 7 and the rear-surface bus electrode 15 and the rear surface lead 7 practically have the same width.

The rear surface of the substrate 11 can be covered by a silver electrode over its entire surface. However, because costs are increased, the rear-surface bus electrode 15 made of silver is particularly provided only at a position where the rear surface lead 7 is connected as explained above. In addition to the rear-surface bus electrode 15 formed in a line shape as in the present embodiment, the rear-surface bus electrode 15 can be provided discretely in a dotted manner (in a stepping-stone manner). According to the present embodiment, before the solar battery cells produced in a square as explained above are connected one another with the light-receiving surface lead 4 and the rear surface lead 7, each of the solar battery cells is divided into two in the direction in which the light-receiving-surface bus electrode 14 extends, so that the rectangular solar battery cell 20 with the ratio of the short side length S and the long side length L being 1/2:1 is obtained.

To obtain the divided solar battery cell 20, predetermined processes are first performed to form the light-receiving-surface bus electrode 14, the grid electrode 13, the rear-surface collecting electrode 12, and the rear-surface bus electrode 15 on the square substrate 11, thereby producing a solar battery cell (a first solar battery cell) serving as a base. At this time, a light-receiving-surface electrode area and a rear-surface electrode area where the electrodes are formed, respectively, are each formed into two areas in a divided manner along a division line. By cutting the solar battery cell along the division line, the rectangular solar battery cell 20 as mentioned above is obtained. While the solar battery cell 20 according to the present embodiment is obtained by dividing the solar battery cell produced in a square into two, the solar battery cell can be divided into a larger number (n) such as three or four. When the solar battery cell 20 is divided into n, the light-receiving-surface electrode area and the rear-surface electrode area are formed into n areas in advance in a divided manner.

In the solar battery cell 20 with such a configuration, when sunlight is irradiated from the light-receiving surface side (the antireflection film side) of the solar battery cell 20 to reach an internal pn junction surface (a junction surface of the p-type layer and the n-type diffusion layer), holes and electrons coalesced on the pn junction surface are separated from each other. The separated electrons move toward the n-type diffusion layer. Meanwhile, the separated holes move toward the p+ layer. Accordingly, a potential difference is generated between the n-type diffusion layer and the p+ layer so that a potential of the p+ layer is higher. Consequently, a front-surface electrode connected to the n-type diffusion layer becomes a negative electrode and a rear-surface electrode connected to the p+ layer becomes a positive electrode. When an external circuit (not shown) is connected to this solar battery cell 20, an electric current flows therein and the solar battery cell 20 performs an operation as a solar battery. While an output voltage of one solar battery cell is small, plural solar battery cells 20 are connected in series or in parallel to each other in the solar battery module 90, so that the output voltage is increased to a usable voltage.

Serial connection of the solar battery cells 20 is achieved by, in plural solar battery cells arranged in the first direction, electrically connecting the light-receiving-surface bus electrode 14 of a first solar battery cell 20 (20A) to the rear-surface bus electrode 15 of a second solar battery cell 20 (20B) adjacent to the first solar battery cell 20 (20A) with the band-shaped leads 4 and 7 (FIGS. 5 to 8).

Figure 9:
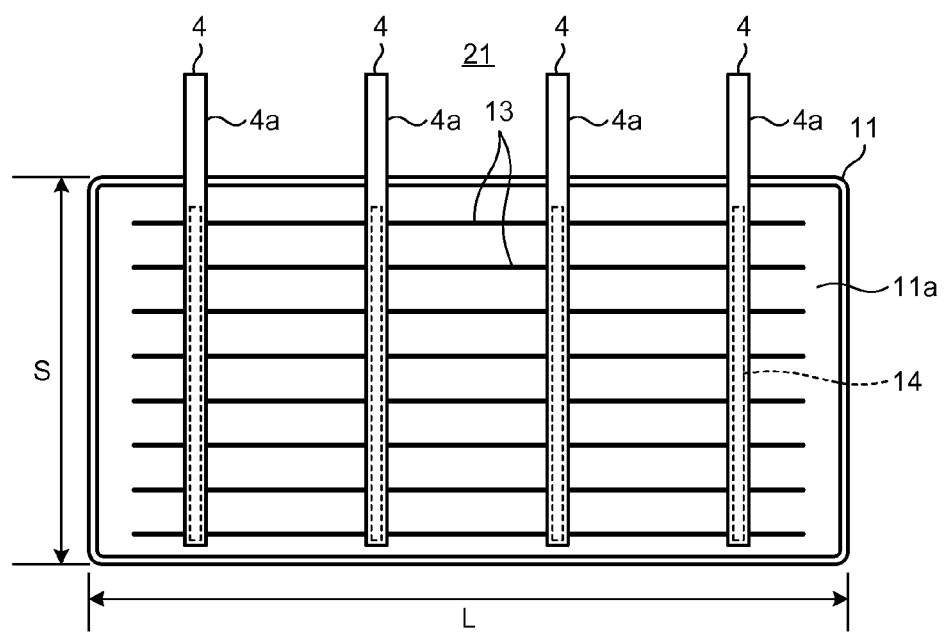
FIG. 9 is a top view of a state in which a light-receiving-surface bus electrode is joined to a solar battery cell used for a solar battery module according to a second embodiment of the present invention.

According to the present embodiment, the leads 4 and 7 are provided separately as the light-receiving surface lead 4 and the rear surface lead 7, respectively. Among the leads, the light-receiving surface lead 4 extends on the light-receiving-surface bus electrode 14 to be solder-joined (mechanically and electrically connected) to the light-receiving-surface bus electrode 14. The light-receiving surface lead 4 has an extended portion 4a formed to be longer than the solar battery cell 20. When the light-receiving surface lead 4 is solder-joined to the light-receiving-surface bus electrode 14, the extended portion 4a protrudes toward one end side (FIGS. 3, 5, and 9).

The rear surface lead 7 extends on the rear-surface bus electrode 15 to be solder-joined (mechanically and electrically connected) to the rear-surface bus electrode 15. To serially connect the first solar battery cell 20 (20A) to the second solar battery cell 20 (20B), the light-receiving surface lead 4 of the first solar battery cell 20 (20A) is solder-joined to the rear surface lead 7 of the second solar battery cell 20 (20B). That is, the extended portion 4a of the light-receiving surface lead 4 of the first solar battery cell 20 (20A) is slipped under the rear surface side of the adjacent second solar battery cell 20 (20B) to be solder-joined to the rear surface lead 7 solder-joined to the rear-surface bus electrode 15. While only connection of the first solar battery cell 20 (20A) and the second solar battery cell 20 (20B) adjacent to each other is explained, the same connection is practically repeated, so that plural solar battery cells 20 are serially connected to each other. While the leads are provided separately as the light-receiving surface lead 4 and the rear surface lead 7 in the present embodiment as explained above, the leads can be one continuous lead.

The light-receiving surface lead 4 is placed to be superimposed on the light-receiving-surface bus electrode 14 and the rear surface lead 7 is placed to be superimposed on the rear-surface bus electrode 15. The light-receiving surface lead 4 and the rear surface lead 7 are then pressed against the solar battery cell 20 partially or over the entire length while being heated. Because the light-receiving surface lead 4 and the rear surface lead 7 are coated with solder, the solder melts by heating and the leads 4 and 7 are solder-joined to the bus electrodes 14 and 15, respectively, by being pressed in this state. The first solar battery cell 20 (20A) and the second solar battery cell 20 (20B) are then arranged, the extension portion 4a of the light-receiving surface lead 4 of the first solar battery cell 20 (20A) is slipped under the rear surface side of the second solar battery cell 20 (20B) to be superimposed on an end of the rear surface lead 7, and the light-receiving surface lead 4 and the rear surface lead 7 are solder-joined to each other by being pressed while heated. Connection of the light-receiving surface lead 4 and the rear surface lead 7 to the solar battery cell 20 and connection of the light-receiving surface lead 4 to the rear surface lead 7 can be simultaneously performed at the same step.

The cell array 5 having plural solar battery cells 20 serially connected to each other as explained above is sealed between the front-surface cover material (glass) 3 and the back sheet 10 (the rear-surface cover material) with the resins 8a and 8b, so that the solar battery panel 70 is formed as shown in FIG. 7. The frame member 80 is attached to this solar battery panel 70 as shown in FIG. 1 and output cables (a positive electrode and a negative electrode) (not shown) are connected via a terminal box (not shown) to the solar battery panel 70, thereby configuring the solar battery module 90. The output voltage of the solar battery module 90 is a value corresponding to voltages of the plural solar battery cells 20 serially connected to each other.

According to the solar battery module with such a configuration, an electric current per one solar battery cell 20 can be halved by dividing the solar battery cell 20 into two, and thus a resistance loss caused by electrical connection can be reduced. Accordingly, a solar battery module with a higher output than that of a solar battery module that incorporates therein a conventional square solar battery cell which is not divided can be provided.

Second Embodiment.

Figure 10:
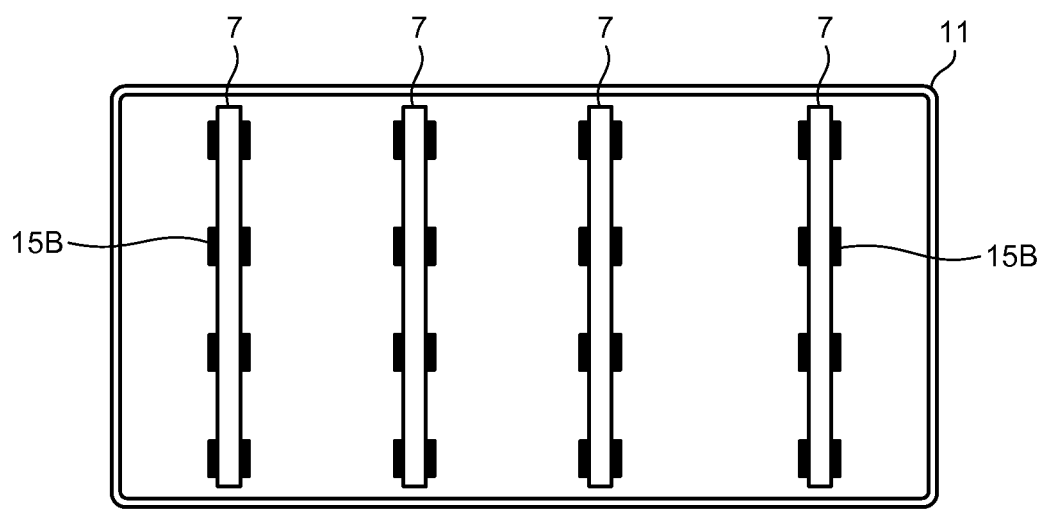
FIG. 10 is a rear view of a state in which a rear-surface bus electrode is joined to the solar battery cell.
Figure 11:
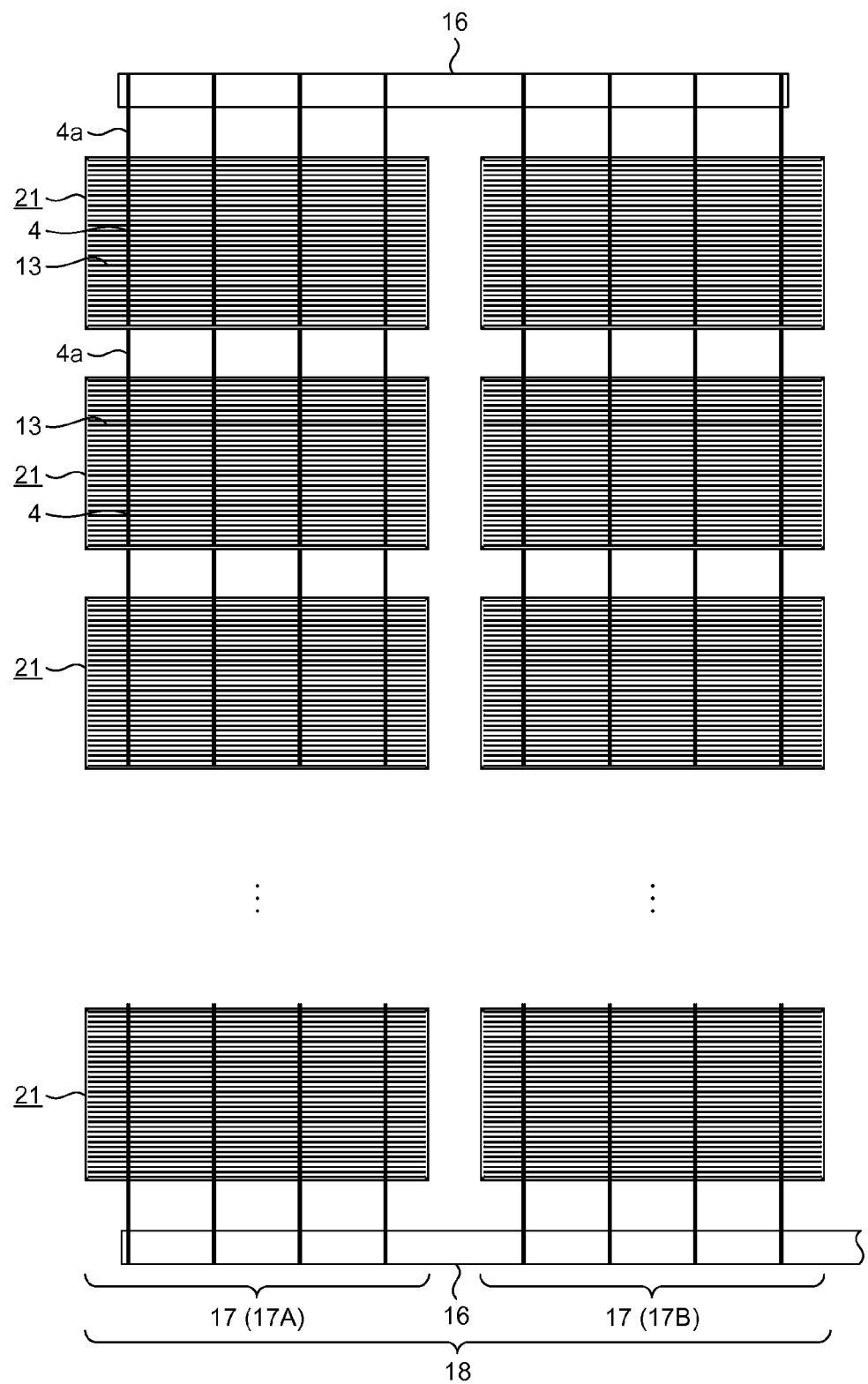
FIG. 11 is a top view of a state in which the solar battery cells are connected according to the second embodiment.
Figure 12:
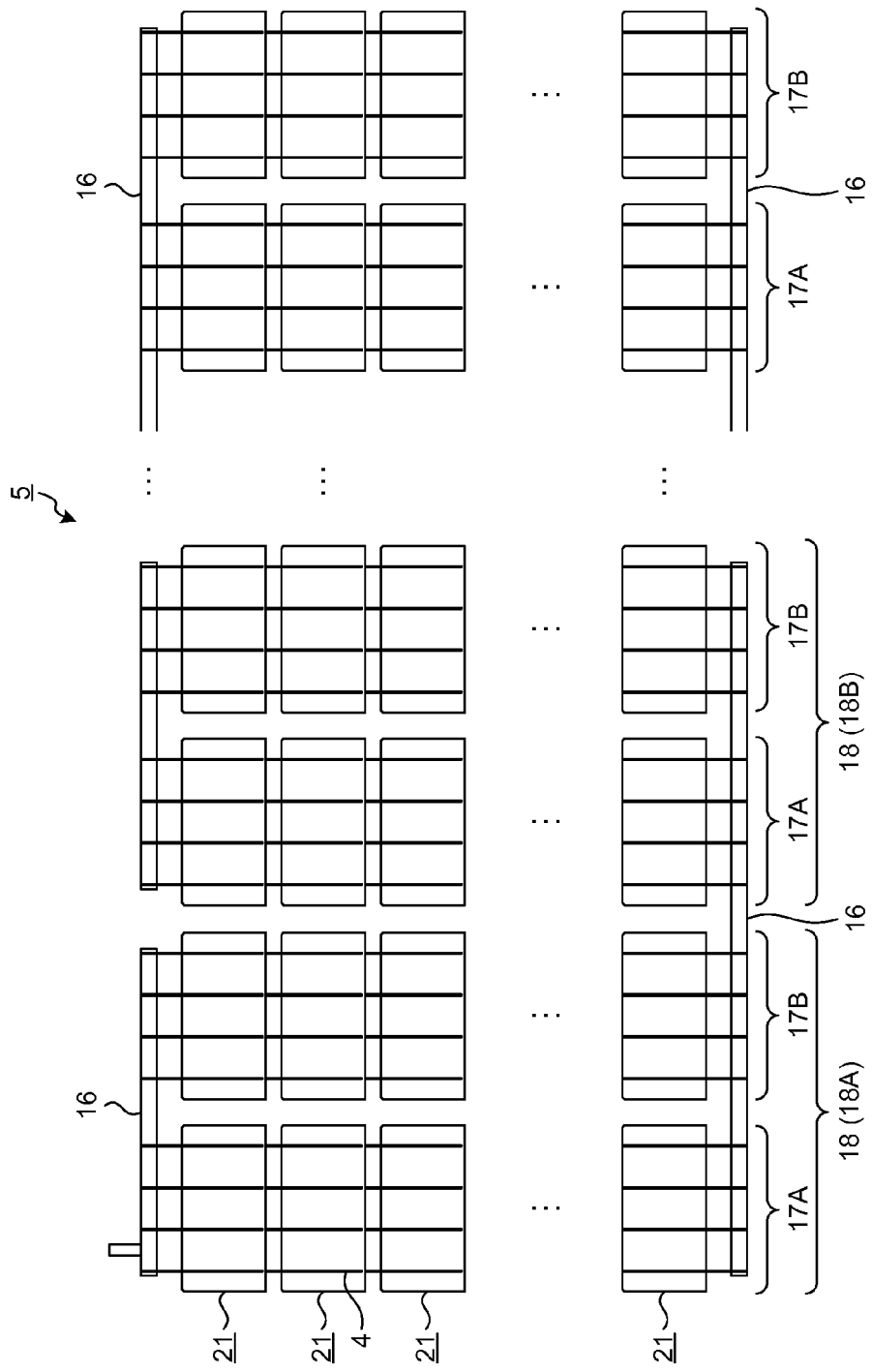
FIG. 12 is a schematic diagram of a method of connection in a cell array according to the second embodiment.

FIG. 9 is a top view of a state in which a light-receiving-surface bus electrode is joined to a solar battery cell used for a solar battery module according to a second embodiment of the present invention. FIG. 10 is a rear view of a state in which a rear-surface bus electrode is joined to the solar battery cell. FIG. 11 is a top view of a state in which the solar battery cells are connected according to the second embodiment. FIG. 12 is a schematic diagram of a method of connection in a cell array according to the second embodiment. A solar battery cell 21 according to the present embodiment is produced by dividing a square solar battery cell into two in the direction that the light-receiving-surface bus electrode 14 extends, and the ratio of the short side length S and the long side length L is 1/2:1 as in the first embodiment (FIG. 9).

The solar battery cell 21 according to the present embodiment, as shown in FIG. 9, has four light-receiving-surface bus electrodes 14 extending parallel to the short side on the light-receiving surface side and each of the light-receiving-surface bus electrodes 14 is joined to the light-receiving surface lead 4. On the rear surface side, a rear-surface bus electrode (a rear-surface lead connection electrode) 15B made of silver is provided at a position corresponding to the light-receiving-surface bus electrode 14 (at a position where the rear-surface bus electrode 15B overlaps the light-receiving-surface bus electrode 14 in a thickness direction of the substrate 11) in the first direction as the direction that solar battery cells are connected to each other in a dotted manner (in a stepping-stone manner) along the lead in four columns. The rear surface lead 7 is joined to the rear-surface bus electrodes 15B of each column. Plural solar battery cells 21 are sequentially connected in series so that the four light-receiving-surface bus electrodes 14 are connected to the four-column rear-surface bus electrodes 15B with the light-receiving surface lead 4 and the rear surface lead 7 as in the first embodiment.

As shown in FIGS. 11 and 12, a predetermined number of the solar battery cells 21 are serially connected to each other, thereby forming a first cell string 17 (17A). The solar battery cells 21 of the same number are serially connected to each other, thereby forming a second cell string 17 (17B). An end portion of the first cell string 17 (17A) and an end portion of the second cell string 17 (17B) are joined to each other by a string connector 16, thereby forming a first parallel-connected cell string 18 (18A). Further, the first parallel-connected cell string 18 (18A) and a second parallel-connected cell string 18 (18B) connected as the first parallel-connected cell string 18 (18A) are serially connected to each other by the string connector 16 (FIG. 12). A predetermined number of columns of the column-connected cell strings 18 are serially connected to each other in the same manner.

The cell array 5 with the plural solar battery cells 21 being serially connected to each other as explained above is sealed between the front-surface cover material (glass) 3 and the back sheet 10 (the rear-surface cover material) with the resins 8a and 8b as shown in FIG. 7, so that the solar battery panel 70 is formed. The frame member 80 is then attached to this solar battery panel 70 as shown in FIG. 1 and output cables (the positive electrode and the negative electrode) (not shown) are further connected via a terminal box (not shown) to the solar battery panel 70, so that the solar battery module 90 is configured.

While the first parallel-connected cell string 18 (18A) is serially connected to the second parallel-connected cell string 18 (18B) in FIG. 12, the light-receiving surface lead 4 joined to the light-receiving-surface bus electrode 14 of an end cell (a cell at a position that is the nearest to the string connector 16) of the first parallel-connected cell string 18 (18A) is specifically connected to the string connector 16 and this string connector 16 is connected to the rear surface lead 7 joined to the rear-surface bus electrode 15B of a head cell (a cell at a position that is the nearest to the string connector 16) of the second parallel-connected cell string 18 (18B). That is, because the cell strings 18 need to be connected to each other electrically in series by considering polarities, the first parallel-connected cell string 18 (18A) and the second parallel-connected cell string 18 (18B) electrically differ in their orientations.

Also the solar battery cell 21 according to the present embodiment can be formed by dividing a cell obtained by performing predetermined processes upon a substantially-square p-type silicon substrate whose vertical and horizontal sides have the same length into two. Because the area of the cell is halved, a power generation current is halved, and thus an electric current flowing in the leads 4 and 7 is halved as compared to a case of a square cell. Consequently, a resistance loss (W) of the leads 4 and 7 can be reduced to ¼ according to a relationship W=(electrical resistance of leads 4 and 7)×(flowing current)$^2$ and thus the output of the solar battery module can be improved.

When the arrangement (the connection) of cells in a module is considered, with respect to characteristics of a module in a case of serially connecting all halved cells, an electric current is halved and a voltage is doubled as compared to characteristics of a module having the same external dimension in which non-divided cells are all serially connected.

When assuming that the voltage of one non-divided cell is V, the t thereof is I, and 60 non-divided cells are serially connected to each other, thereby configuring a module, the voltage of the module is 60×V and the electric current thereof is I. On the other hand, the voltage of a halved cell is V and the electric current thereof is 0.5×I. Accordingly, in a module configured by serially connecting 120 halved cells (because the external dimension of the module is the same, the number of halved cells to be used becomes twice), the voltage is 120×V and the electric current is 0.5×I. That is, because electrical output characteristics of modules are different, consideration is required, for example, the arrangement of modules on a roof (the number of serial/parallel connected modules on a roof) needs to be significantly changed with respect to a method of connecting to an inverter.

When a parallel-connected cell string having two cell strings each of which is formed by serially connecting a predetermined number of halved cells being connected in parallel to each other is configured and all the parallel-connected cell strings are serially connected to each other as explained above, electrical output characteristics of the resultant module is the voltage of 60×V and the electric current of I, which are equivalent to those of the module having all non-divided cells serially connected to each other. Accordingly, with respect to the method of connecting to an inverter, consideration is not required, for example, arrangement of modules on a roof (the number of serial/parallel connected modules on a roof) does not need to be changed significantly. Further, when a module formed by the conventional non-divided cells is broken in an existing solar power generation system, a module formed by the halved cells can be used as an alternative product because their characteristics are the same.

As explained above, the resistance loss caused by the leads 4 and 7 is reduced due to the halved current value in the module formed by the halved cells. The above explanations have been made while ignoring the resistance loss for easy understanding.

Third Embodiment.

Figure 13:
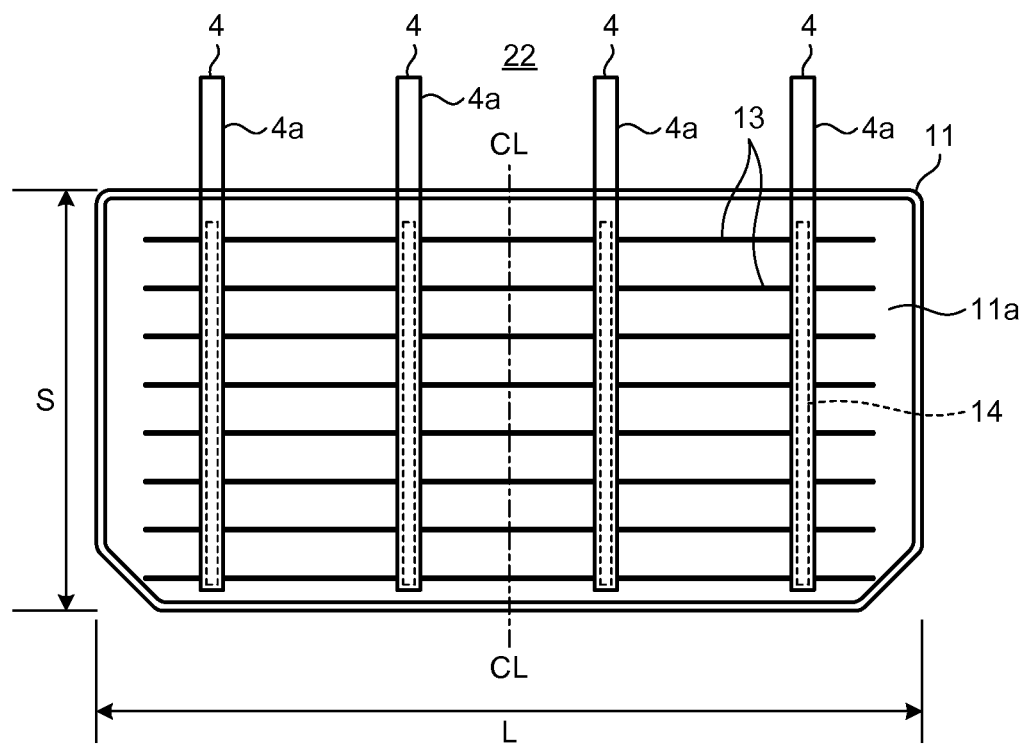
FIG. 13 is a top view of a state in which a light-receiving-surface bus electrode is joined to a solar battery cell used for a solar battery module according to a third embodiment of the present invention.
Figure 14:
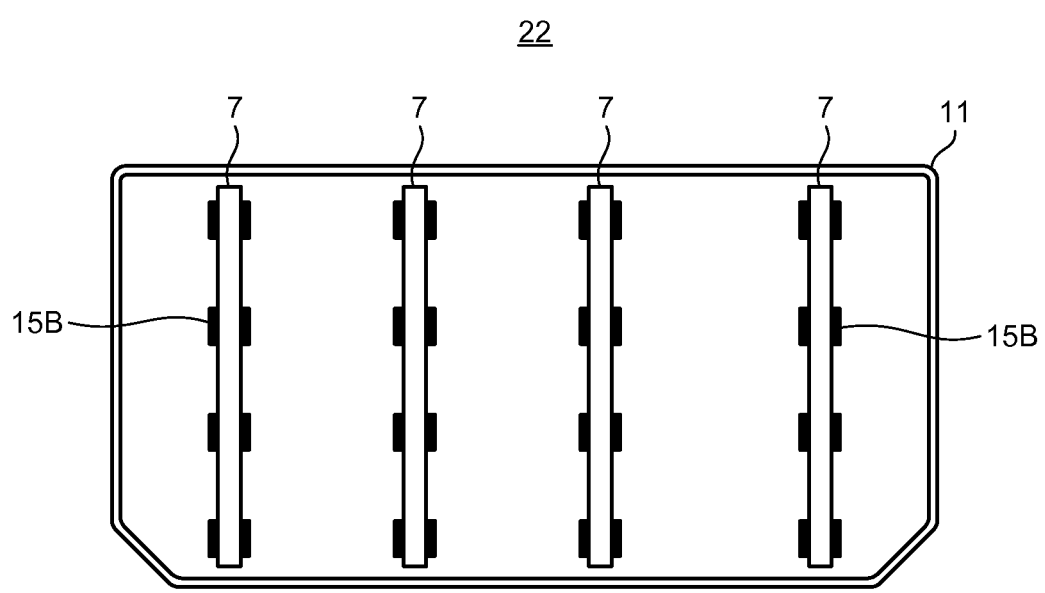
FIG. 14 is a rear view of a state in which a rear-surface bus electrode is joined to the solar battery cell.

FIG. 13 is a top view of a state in which a light-receiving-surface bus electrode is joined to a solar battery cell used for a solar battery module according to a third embodiment of the present invention. FIG. 14 is a rear view of a state in which a rear-surface bus electrode is joined to the solar battery cell. FIG. 15 is a schematic diagram of a method of connection in a cell array according to the third embodiment.

A solar battery cell 22 according to the present embodiment is produced by dividing a square solar battery cell into two in the direction that the light-receiving-surface bus electrode 14 extends and the ratio of the short side length S and the long side length L is 1/2:1 as in the first embodiment. The solar battery cell 22 is formed in such a shape that at an end portion on one lateral side, a corner formed between a long side and a short side at each of both ends of the long side is cut by about 45°. Other configurations of the third embodiment are identical to those of the second embodiment. This corner-cut solar battery cell 22 with its corners being cut similarly configures a solar battery module instead of the solar battery cell 21 according to the second embodiment.

The corner-cut solar battery cell 22 is formed in such a pattern that the light-receiving-surface bus electrode 14 and the rear-surface bus electrode 15B are line-symmetrical with respect to an imaginary central line CL passing through a middle point of the long side and parallel to the short side.

The halved cells are arranged in a module to match directions of long sides or short sides of the substantial rectangles. At this time, when the light-receiving-surface bus electrode 14 of a certain cell and the rear-surface bus electrode 15B of an adjacent cell are in the same straight line, these cells can be connected to each other at the shortest distance by the leads 4 and 7 and a connecting operation thereof is easy. In a case of the solar battery cell 22 formed in such a manner that the light-receiving-surface bus electrodes 14 and the rear-surface bus electrodes 15B are line-symmetrical with respect to the imaginary center line CL as explained above, the light-receiving-surface bus electrodes 14 on the light-receiving surface side and the rear-surface bus electrodes 15B are in the same straight lines even when the cell is rotated by 180° or not, and thus the cells can be connected to each other by extending the leads 4 and 7. That is, an operation of matching directions of arranging cells to cause the light-receiving-surface bus electrodes 14 and the rear-surface bus electrodes 15B to be in the same straight lines is not required.

As shown in FIG. 15, in the cell array 5 according to the present embodiment, when the corner-cut solar battery cells 22 are serially connected to each other, thereby forming the cell strings 17A and 17B, the corner-cut solar battery cells 22 are connected to change orientations of adjacent solar battery cells 22 by 180° (to cause long sides with their corners not being cut to face to each other, for example), thereby configuring the cell array 5.

Generally, a mono-crystalline silicon substrate often has corners with a corner-cut portion of about 45° because of size restriction of an ingot serving as a material for the substrate. Accordingly, when cells are arranged in a module with the substrate divided into two, the corner-cut portions appear alternatively such as on an upper side, a lower side, ... of arranged cells. For example, to arrange cells in such a manner that the corner-cut portions are always on the upper side, a lower-half one of a cell divided into two needs to be arranged after being rotated by 180°. At that time, if the light-receiving-surface bus electrodes 14 and the rear-surface bus electrodes 15B are in the same straight lines even when the lower-half side cell is rotated by 180°, the cells can be serially connected to each other by the leads 4 and 7. This is possible in the solar battery cell 22 according to the present embodiment formed in such a manner that the light-receiving-surface bus electrodes 14 and the rear-surface bus electrodes 15B are line-symmetrical with respect to the imaginary center line CL passing through the middle point of the long sides and parallel to the short sides as mentioned above.

Fourth Embodiment.

When a conventional substantially-square cell is divided into two, thereby forming two substantially-rectangular cells, no light-receiving-surface bus electrode, no grid electrode, and no rear-surface bus electrode are formed in advance in an area with a predetermined width along a line of dividing the original substantially-square cell. That is, an area where these electrodes do not exist is formed at a circumferential edge portion of the halved substantially-rectangular cell.

According to the solar battery cell produced as explained above, because no electrode is formed at the circumferential edge portion of the halved substantially-rectangular cell, it is possible to suppress a reduction in characteristics of the cell caused by damages of a divided end generated at the time of dividing. Further, by preventing thermal stress at the time of joining leads (interconnectors) from propagating to the cell end, breakage of cells at the time of modularization can be suppressed. Because the circumferential edge portion of a cell can capture secondary light reflected by a rear-surface cover material of the module, an effect of improving characteristics of the module is also provided.

INDUSTRIAL APPLICABILITY

As described above, the solar battery module according to the present invention is useful to be applied to a solar battery module, a plurality of which are arranged and installed on a roof or the like in a solar power generation system that converts light energy such as sunlight into electric energy, and particularly is suitable to be applied to a solar battery module that includes a plurality of solar battery cells each having a plurality of light-receiving-surface bus electrodes parallel to a short side of a substantial rectangle on a light receiving surface and having a rear-surface bus electrode at a position on a non-light-receiving surface corresponding to each of the light-receiving-surface bus electrodes.

REFERENCE SIGNS LIST 3 front-surface cover material (glass)
4 light-receiving surface lead (interconnector)
4a extension portion
5 cell array
7 rear surface lead (interconnector)
8, 8a, 8b resin (sealing material)
9 cell arrangement layer
10 rear-surface cover material
11 p-type silicon substrate
12 rear-surface collecting electrode
13 grid electrode
14 light-receiving-surface bus electrode (light-receiving-surface lead-connection electrode)
15, 15B rear-surface bus electrode (rear-surface lead-connection electrode)
16 string connector
17, 17A, 17B cell string
20, 20A, 20B, 21, 22 solar battery cell
70 solar battery panel
80 frame member
90 solar battery module

The invention claimed is:

1. A solar battery module comprising:
a plurality of solar battery cells, a plain shape of each being a substantial rectangle, and a ratio of a short side length and a long side length of the substantial rectangle being 1/n:1 (n is an integer equal to or larger than 2), includes a plurality of light-receiving-surface bus electrodes parallel to the short side of the substantial rectangle on a light receiving surface, and includes rear-surface bus electrodes each at a position on a non-light-receiving surface corresponding to each of the light-receiving-surface bus electrodes; and
an interconnector that electrically connects the light-receiving-surface bus electrodes of a first one of the solar battery cells to the rear-surface bus electrodes of an adjacent second one of the solar battery cells, wherein a predetermined number of the solar battery cells are serially connected to each other, thereby configuring a cell string, n columns of the cell strings are connected in parallel by a first string connector at one end of the n columns, the n in the number of columns of the cell strings connected in parallel being equal to the n in the ratio of the long side length to the short side length, and the n-column parallel-connected cell strings are further serially connected to another n-column parallel-connected cell strings by a second string connector at an opposite end of the n columns, thereby configuring an entire cell array.

2. The solar battery module according to claim 1, wherein a predetermined number of the solar battery cells are serially connected, thereby configuring a cell string, two columns of the cell strings are connected in parallel, and the two-column parallel-connected cell strings are further serially connected, thereby configuring an entire cell array.

3. The solar battery module according to claim 1, wherein the light-receiving-surface bus electrodes of each solar battery cell are formed at positions that are line-symmetrical with respect to a line passing through a middle point of a side perpendicular to an extended line of the light-receiving-surface bus electrodes and parallel to the light-receiving-surface bus electrodes.

4. The solar battery module according to claim 1, wherein the light-receiving-surface bus electrodes of each solar battery cell are formed at positions that are line-symmetrical with respect to a line passing through a middle point of a side parallel to the light-receiving-surface bus electrodes and perpendicular to the light-receiving-surface bus electrodes.

5. The solar battery module according to claim 1, wherein each of the solar battery cells includes an area where the light-receiving-surface bus electrodes and the rear-surface bus electrodes are not formed within a predetermined dimension from an edge toward a central direction of the cell at an outer circumferential edge portion thereof.

6. The solar battery module according to claim 1, which is obtained by dividing a basic solar battery cell with a plane shape thereof being a substantial square, which includes n light-receiving-surface electrode areas in each of which a plurality of light-receiving-surface bus electrodes parallel to a side of the substantial square and a plurality of grid electrodes perpendicular to the light-receiving-surface bus electrodes are provided on a light-receiving surface side and includes rear-surface bus electrodes each at a position on a non-light-receiving surface side corresponding to each of the light-receiving-surface bus electrodes into n respective boundaries of the n light-receiving-surface electrode areas.

7. The solar battery module according to claim 1, wherein the second string connector extends continuously across the entire cell array.

8. The solar battery module according to claim 1, wherein the interconnector is joined to the light-receiving-surface bus electrode of a solar battery cell nearest to the second string connector of the n-column parallel-connected cell strings, and is connected to the second string connector, and the second string connector is connected to a rear surface lead at the rear-surface bus electrode of a head solar battery cell nearest the second string connector of the another n-column parallel-connected cell strings.

9. The solar battery module according to claim 1,
wherein long sides of the substantial rectangle include a first long side and a second long side,
the substantial rectangle has chamfered corners on both ends of only the first long side such that the second long side is without chamfered corners, and
wherein the first one of the solar battery cells and the second one of the solar battery cells are arranged in the cell array such that the first long side and the second long side of the first one and the second one of the solar battery cells do not face each other.

10. A solar battery module comprising:
a plurality of solar battery cells, a plain shape of each being a substantial rectangle, and a ratio of a short side length and a long side length of the substantial rectangle being 1/n:1 (n is an integer equal to or larger than 2), includes a plurality of light-receiving-surface bus electrodes parallel to the short side of the substantial rectangle on a light receiving surface, and includes rear-surface bus electrodes each at a position on a non-light-receiving surface corresponding to each of the light-receiving-surface bus electrodes; and
an interconnector that electrically connects the light-receiving-surface bus electrodes of a first one of the solar battery cells to the rear-surface bus electrodes of an adjacent second one of the solar battery cells, wherein
long sides of the substantial rectangle include a first long side and a second long side,
the substantial rectangle has chamfered corners on both ends of only the first long side such that the second long side is without chamfered corners, and
the first one of the solar battery cells and the second one of the solar battery cells are arranged in the module such that the first long side and the second long side of the first one and the second one of the solar battery cells do not face each other.

11. The solar battery module according to claim 1, wherein the solar battery cells in the cell array are arranged so that the short side lengths are parallel to the extension of the n-column parallel-connected cell strings.

* * * * *